(12) United States Patent
Melius et al.

(10) Patent No.: US 10,788,538 B2
(45) Date of Patent: Sep. 29, 2020

(54) PREDICTIVE BATTERY TEST SYSTEMS AND METHODS

(71) Applicant: General Electric Company, Schenectady, NY (US)

(72) Inventors: Jeffrey Alan Melius, Roanoke, VA (US); Darren John Danielsen, Simpsonville, SC (US); Parag Rameshchandra Dharmadhikari, Neufahrn b. Freising (DE); Christopher Lee Tschappatt, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 273 days.

(21) Appl. No.: 15/701,987

(22) Filed: Sep. 12, 2017

(65) Prior Publication Data
US 2019/0079139 A1    Mar. 14, 2019

(51) Int. Cl.
*G01R 31/392* (2019.01)
*H01M 10/44* (2006.01)
(Continued)

(52) U.S. Cl.
CPC ........ *G01R 31/392* (2019.01); *G01R 31/3646* (2019.01); *G01R 31/3648* (2013.01);
(Continued)

(58) Field of Classification Search
CPC .............. G01R 31/392; G01R 31/3646; G01R 31/364; G01R 31/389; G01R 31/385;
(Continued)

(56) References Cited

U.S. PATENT DOCUMENTS

| 6,087,808 A | 7/2000 | Pritchard |
| 6,906,543 B2 | 6/2005 | Lou et al. |

(Continued)

FOREIGN PATENT DOCUMENTS

| EP | 2703829 A1 | 3/2014 |
| WO | WO 2016/174233 A1 | 11/2016 |

OTHER PUBLICATIONS

Genesis Purelead, Application Manual, sixth edition, Jun. 2005, Publication No. US-GPL-AM-002, pp. 1-28.
(Continued)

*Primary Examiner* — Melissa J Koval
*Assistant Examiner* — Trung Nguyen
(74) *Attorney, Agent, or Firm* — Dority & Manning, P.A.

(57) ABSTRACT

Apparatus, systems, and methods are provided for determining remaining lifetime of a battery, such as a battery used to power a pitch drive system in a wind turbine. In one example implementation, a method can include controlling a discharge of the battery through a load. The method can include obtaining data indicative of a discharge voltage and a discharge current of the battery during discharge through the load. The method can include obtaining data indicative of a temperature associated with the battery during discharge through the load. The method can include determining data indicative of remaining lifetime of the battery as a function of the discharge voltage, discharge current, and the temperature. The method can include performing at least one control action based at least in part on the data indicative of remaining lifetime of the battery.

12 Claims, 9 Drawing Sheets

(51) Int. Cl.
  *G01R 31/389* (2019.01)
  *G01R 31/36* (2020.01)
  *G01R 31/385* (2019.01)
  *H01M 10/48* (2006.01)
  *H02J 11/00* (2006.01)

(52) U.S. Cl.
  CPC ......... *G01R 31/385* (2019.01); *G01R 31/389* (2019.01); *H01M 10/44* (2013.01); *H01M 10/48* (2013.01); *H01M 10/486* (2013.01); *H02J 11/00* (2013.01); *H01M 2220/10* (2013.01)

(58) Field of Classification Search
  CPC .... H01M 10/44; H01M 10/48; H01M 10/486; H01M 2220/10; H02J 11/00
  USPC ........ 324/750.3, 765.01, 500, 761.01, 76.11, 324/76.37, 425–450
  See application file for complete search history.

(56) References Cited

U.S. PATENT DOCUMENTS

| | | | |
|---|---|---|---|
| 7,199,557 B2 | 4/2007 | Anbuky et al. | |
| 8,372,277 B2 | 2/2013 | Kania et al. | |
| 8,570,695 B2 | 10/2013 | Shibuya et al. | |
| 9,263,878 B2 | 2/2016 | Itou et al. | |
| 9,298,761 B2 | 3/2016 | Graefe | |
| 9,658,290 B2 * | 5/2017 | Frison | G01R 31/396 |
| 2007/0252600 A1 | 11/2007 | Chou et al. | |
| 2008/0150541 A1 | 6/2008 | Salman et al. | |
| 2012/0253537 A1 * | 10/2012 | Okuda | H02J 3/32 700/296 |
| 2013/0038292 A1 * | 2/2013 | Barrett | G01R 31/3833 320/134 |
| 2014/0015532 A1 | 1/2014 | Uchida et al. | |
| 2014/0257751 A1 | 9/2014 | Edenfeld | |
| 2015/0130421 A1 | 5/2015 | Bevilacqua | |
| 2016/0149272 A1 | 5/2016 | Imaizumi | |

OTHER PUBLICATIONS

U.S. Appl. No. 15/629,879, filed Jun. 22, 2017.
European Search Report dated Dec. 17, 2018.

* cited by examiner

PREDICTIVE BATTERY TEST SYSTEMS AND METHODS

FIELD

The present disclosure relates generally to determining remaining lifetime of battery energy storage devices, such as batteries capable of operating pitch drive systems in a wind power system.

BACKGROUND

Batteries can be used to provide power in a variety of different applications. A battery can lose the ability to provide sufficient voltage to power a load as the battery ages. For instance, as a battery approaches end of life, an output voltage provided to a load can drop quickly. The inability of the battery to provide a required output voltage to power a load in certain condition can pose many challenges. For instance, the inability of a battery to power a load in a pitch drive system of a wind turbine system can result in an inability to pitch a wind turbine blade on a wind turbine, potentially leading to damage to the wind turbine.

BRIEF DESCRIPTION

Aspects and advantages of the invention will be set forth in part in the following description, or may be obvious from the description, or may be learned through practice of the invention.

One example aspect of the present disclosure is directed to a method for determining the remaining lifetime of a battery, such as a battery used to power a pitch system of a wind turbine. The method includes controlling, by one or more control devices, a discharge of the battery through a load. The method includes obtaining, by the one or more control devices, data indicative of a discharge voltage and a discharge current of the battery during discharge through the load. The method includes obtaining, by the one or more control devices, data indicative of a temperature associated with the battery during discharge through the load. The method includes determining, by the one or more control devices, data indicative of remaining lifetime of the battery as a function of the discharge voltage, the discharge current, and the temperature. The method includes performing, by the one or more control devices, at least one control action based at least in part on the data indicative of the remaining lifetime of the battery.

Another example aspect of the present disclosure is directed to a test system for testing remaining lifetime of a battery used to power a pitch system in a wind turbine. The test system includes a resistive load. The test system includes a voltage sensor configured to measure a discharge voltage of the battery. The test system includes a current sensor configured to measure a discharge current of the battery. The test system includes a temperature sensor configured to measure a temperature associated with the battery. The test system includes a switching device configured to couple the resistive load to a battery. The test system includes a control device having one or more processors configured to execute computer-readable instructions stored in one or more memory devices to perform operations. The operations include controlling the switching device to couple the resistive load to the battery and discharge the battery through the resistive load. The operations include obtaining data indicative of a discharge voltage of the battery during discharge through the resistive load from the voltage sensor. The operations include obtaining data indicative of a discharge current of the battery during discharge through the resistive load from the current sensor. The operations include obtaining data indicative of the temperature associated with the battery during discharge through the resistive load. The operations include determining, by the one or more control devices, data indicative of an internal resistance of the battery as a function of the discharge voltage, discharge current, and the temperature. The operations includes providing a notification of a fault condition based at least in part on the data indicative of remaining lifetime of the battery.

Another example aspect of the present disclosure is directed to A method for preventing damaging loads from occurring during an adverse grid event of a wind turbine. The method includes conducting a test operation of at least one battery used to power a pitch drive mechanism of a rotor blade of the wind turbine. The method includes determining data indicative of remaining lifetime of the battery as a result of the one or more test operations as a function of a discharge current and a discharge voltage of the battery during the test operation. The method includes determining a fault condition based at least in part on data indicative of remaining lifetime of the battery. The method includes taking a preventive action based at least in part on the fault condition.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
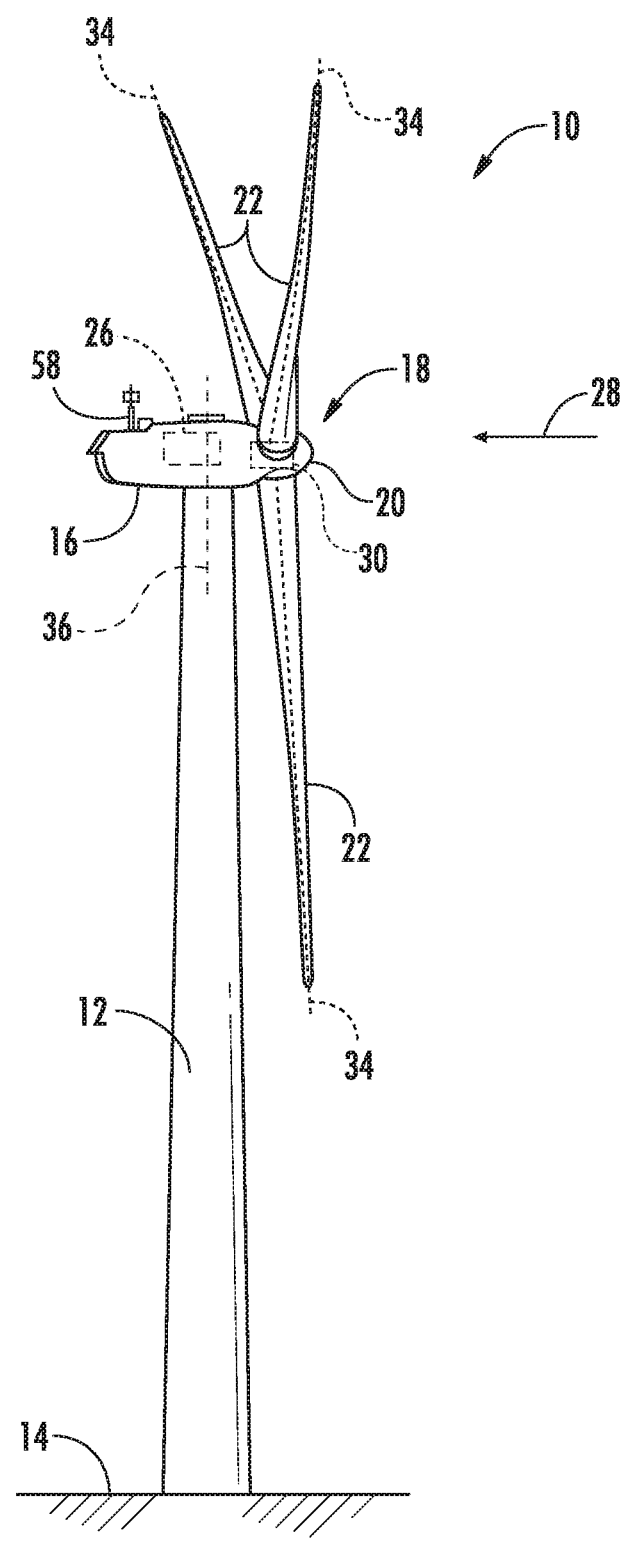
FIG. 1 illustrates a perspective view of a wind turbine according to one embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to systems and methods for determining a remaining lifetime of a battery. A remaining lifetime of a battery refers to the time remaining before the battery can no longer provide an output voltage above a threshold under load after being fully charged. The remaining lifetime of the battery typically decreases after multiple charging and discharging cycles.

According to particular embodiments of the present disclosure, the remaining lifetime of a battery can be determined by subjecting the battery to a test operation. The test operation can include coupling the battery to a resistive load (e.g., a large resistor) and monitoring a discharge current and a discharge voltage of the battery. For instance, the test operation can close a switching element (e.g., a relay) to couple a battery to a resistive load for a time interval, such as a 6 second time interval, 5 second time interval, 4 second time interval, or other suitable time interval.

At the end of the time interval, a control device associated with the battery can obtain data indicative of a discharge current and a discharge voltage of the battery from suitable voltage and current sensors. Data indicative of a temperature associated with the battery (e.g., a temperature of the battery enclosure or cabinet) can also be obtained at the end of the time interval.

An internal resistance of the battery can be determined based on the discharge voltage and the discharge resistance. For instance, in some embodiments, data indicative of a constant no load voltage for the battery can be obtained (e.g., from data specified by the battery manufacturer or from battery testing). A difference between the no load voltage for the battery and the discharge voltage can be determined. The difference can be divided by the discharge current to determine an internal resistance for the battery.

Using the temperature measurement, the internal resistances for a brand new battery (e.g., beginning of life resistance) and worn out battery (e.g., end of life resistance) can be obtained. For instance, in some embodiments, the beginning of life and end of life resistances can be derived experimentally or from data from the battery manufacturer and correlated as a function of battery temperature. Using the measured battery temperature, data indicative of a beginning of life resistance and an end of life resistance can be obtained.

In some embodiments, data indicative of a remaining lifetime of a battery can be determined based on the determined internal resistance and the beginning of life resistance and end of life resistance. For instance, in some embodiments, the data indicative of a remaining lifetime of a battery can be expressed as a percentage of the difference between beginning of life resistance and the end of life resistance relative to a difference between the internal resistance and the end of life resistance.

A controller associated with the battery can be configured to take a control action based on the determined remaining lifetime of the battery. For instance, in some embodiments, a notification of a fault condition can be provided when a remaining lifetime of the battery falls below a threshold. In some embodiments, the notification for the fault condition can be provided when an average remaining lifetime over several operating tests of the battery falls below the threshold.

The notification can be associated with replacing the battery. For instance, in response to the notification, a technician or other user can replace the battery with a fresh battery or battery with sufficient lifetime remaining. In this way, negative events associated with powering systems with worn out batteries can be reduced.

For example, wind power is considered one of the cleanest, most environmentally friendly energy sources presently available, and wind turbines have gained increased attention in this regard. A wind turbine can include a tower, a generator, a gearbox, a nacelle, and a rotor including one or more rotor blades. The rotor blades capture kinetic energy from wind using known foil principles and transmit the kinetic energy through rotational energy to turn a shaft coupling the rotor blades to a gearbox, or if a gearbox is not used, directly to the generator. The generator then converts the mechanical energy to electrical energy that may be deployed to a utility grid.

During operation, the direction of the wind which powers the wind turbine may change. The wind turbine may thus adjust the nacelle through, for example, a yaw adjustment about a longitudinal axis of the tower to maintain alignment with the wind direction. In addition, the wind turbine may adjust a pitch angle of one or more of the rotor blades via a pitch drive mechanism configured with a pitch bearing to change the angle of the blades with respect to the wind.

A pitch drive mechanism can include pitch drive motor, a pitch drive gearbox, and a pitch drive pinion. In such configurations, the pitch drive motor can be coupled to the pitch drive gearbox so that the pitch drive motor imparts mechanical force to the pitch drive gearbox. Similarly, the pitch drive gearbox may be coupled to the pitch drive pinion for rotation therewith. The pitch drive pinion may, in turn, be in rotational engagement with the pitch bearing coupled between the hub and a corresponding rotor blade such that rotation of the pitch drive pinion causes rotation of the pitch bearing. Thus, in such embodiments, rotation of the pitch drive motor drives the pitch drive gearbox and the pitch drive pinion, thereby rotating the pitch bearing and the rotor blade about the pitch axis.

During normal operation, the pitch drive motors can be driven by electrical power from the power grid. However, in some instances, such as during an adverse grid event, the pitch drive motors may be driven by one or more backup batteries. If pitching of the blades relies on such batteries (i.e. due to a grid loss), it is important to ensure that the batteries are capable of operating when needed. Over time, however, the motor batteries of the pitch drive mechanisms lose their capacity to store energy and eventually die. Thus, if such batteries die without notice, the rotor blade associated with the dead batteries may become stuck since there is no power available to pitch the blade. In such instances, loads may increase on the stuck rotor blade, thereby causing damage thereto.

Determining control actions based on determined remaining lifetime of a battery according to example embodiments of the present disclosure can reduce the likelihood of such damage to a wind turbine. For example, a battery used to drive a pitch drive mechanism for a wind turbine can be periodically subjected to a test operation according to example embodiments of the present disclosure. Data indicative of remaining lifetime of the battery can be determined during the test operation. A fault condition can be determined based at least in part on data indicative of the remaining lifetime of the battery. The battery can be replaced, for instance, in response to the fault condition.

As used herein the use of the term "about" in conjunction with a numerical value is intended to refer to within 20% of the stated amount. The use of the term "obtaining" or "obtain" can include receiving, determining, calculating, accessing, reading or otherwise obtaining data.

Aspects of the present disclosure are discussed with reference to a battery used to power a pitch system in a wind turbine. Those of ordinary skill in the art, using the disclosures provided herein, will understand that aspects of the present embodiments can be used with other applications without deviating from the scope of the present disclosure.

Referring now to the drawings, FIG. 1 illustrates a perspective view of one embodiment of a wind turbine 10 according to example aspects of the present disclosure. As shown, the wind turbine 10 includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, the hub 20 may be rotatably coupled to an electric generator 24 (FIG. 2) positioned within the nacelle 16 to permit electrical energy to be produced.

Figure 2:
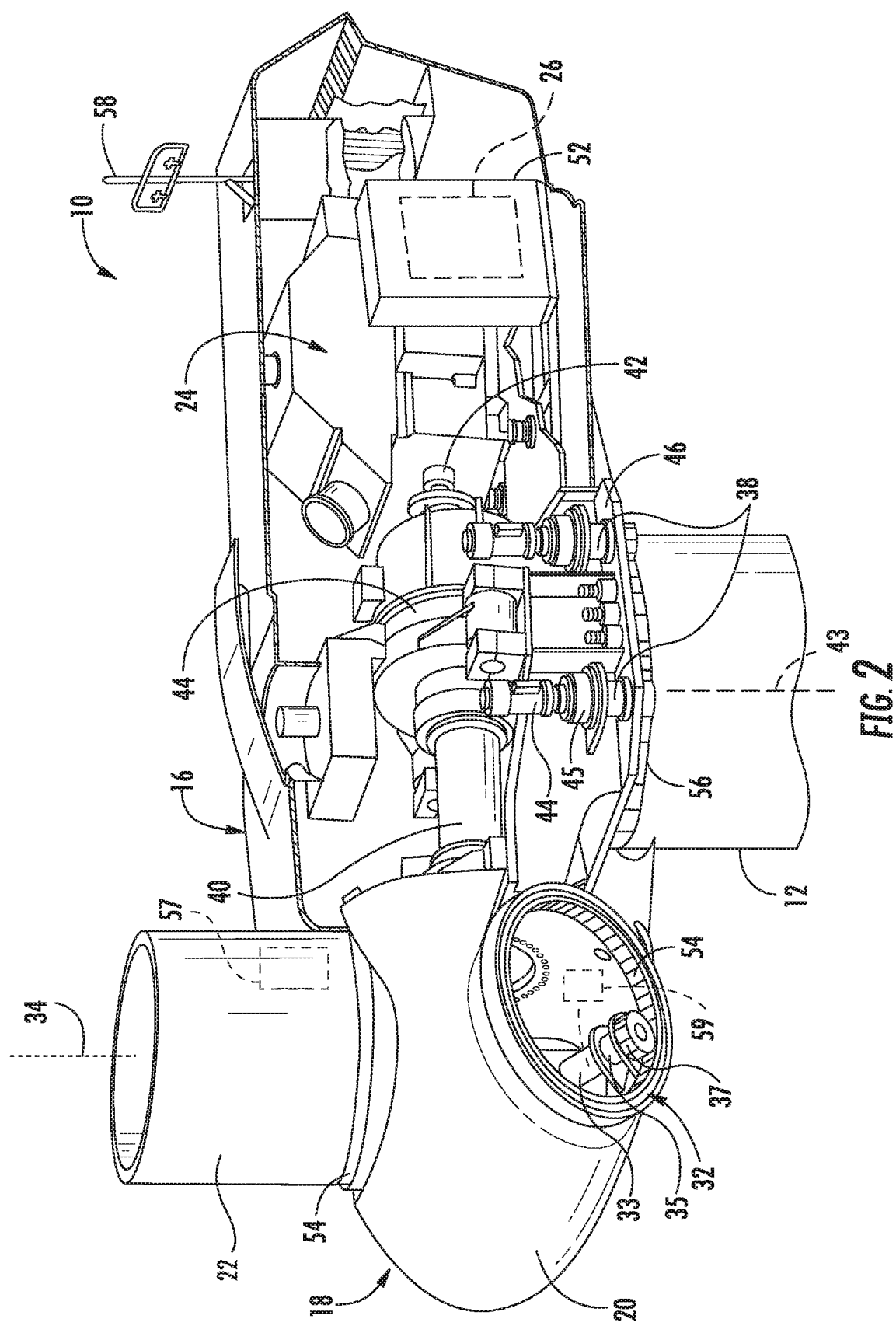
FIG. 2 illustrates a perspective, internal view of a nacelle of a wind turbine according to one embodiment of the present disclosure.

Referring now to FIG. 2, a simplified, internal view of one embodiment of the nacelle 16 of the wind turbine 10 is illustrated. As shown, a generator 24 may be disposed within the nacelle 16. In general, the generator 24 may be coupled to the rotor 18 of the wind turbine 10 for generating electrical power from the rotational energy generated by the rotor 18. For example, the rotor 18 may include a main shaft 40 coupled to the hub 20 for rotation therewith. The generator 24 may then be coupled to the main shaft 40 such that rotation of the main shaft 40 drives the generator 24. For instance, in the illustrated embodiment, the generator 24 includes a generator shaft 42 rotatably coupled to the main shaft 40 through a gearbox 44. However, in other embodiments, it should be appreciated that the generator shaft 42 may be rotatably coupled directly to the main shaft 40. Alternatively, the generator 24 may be directly rotatably coupled to the main shaft 40.

It should be appreciated that the main shaft 40 may generally be supported within the nacelle 16 by a support frame or bedplate 46 positioned atop the wind turbine tower 12. For example, the main shaft 40 may be supported by the bedplate 46 via a pair of pillow blocks 48 mounted to the bedplate 46.

As shown in FIGS. 1 and 2, the wind turbine 10 may also include a turbine control system or a turbine controller 26 within the nacelle 16. For example, as shown in FIG. 2, the turbine controller 26 is disposed within a control cabinet 52 mounted to a portion of the nacelle 16. However, it should be appreciated that the turbine controller 26 may be disposed at any location on or in the wind turbine 10, at any location on the support surface 14 or generally at any other location. The turbine controller 26 may generally be configured to control the various operating modes (e.g., start-up or shut-down sequences) and/or components of the wind turbine 10.

Each rotor blade 22 may also include a pitch adjustment mechanism 32 configured to rotate each rotor blade 22 about its pitch axis 34. Further, each pitch adjustment mechanism 32 may include a pitch drive motor 33 (e.g., any suitable electric, hydraulic, or pneumatic motor), a pitch drive gearbox 35, and a pitch drive pinion 37. In such embodiments, the pitch drive motor 33 may be coupled to the pitch drive gearbox 35 so that the pitch drive motor 33 imparts mechanical force to the pitch drive gearbox 35. Similarly, the pitch drive gearbox 35 may be coupled to the pitch drive pinion 37 for rotation therewith. The pitch drive pinion 37 may, in turn, be in rotational engagement with a pitch bearing 54 coupled between the hub 20 and a corresponding rotor blade 22 such that rotation of the pitch drive pinion 37 causes rotation of the pitch bearing 54. Thus, in such embodiments, rotation of the pitch drive motor 33 drives the pitch drive gearbox 35 and the pitch drive pinion 37, thereby rotating the pitch bearing 54 and the rotor blade 22 about the pitch axis 34. Similarly, the wind turbine 10 may include one or more yaw drive mechanisms 38 communicatively coupled to the controller 26, with each yaw drive mechanism(s) 38 being configured to change the angle of the nacelle 16 relative to the wind (e.g., by engaging a yaw bearing 56 of the wind turbine 10).

Further, the turbine controller 26 may also be communicatively coupled to each pitch adjustment mechanism 32 of the wind turbine 10 (one of which is shown) through a separate or integral pitch controller 30 (FIG. 1) for controlling and/or altering the pitch angle of the rotor blades 22 (i.e., an angle that determines a perspective of the rotor blades 22 with respect to the direction 28 of the wind).

In addition, as shown in FIG. 2, one or more sensors 57, 58, 59 may be provided on the wind turbine 10. More specifically, as shown, a blade sensor 57 may be configured with one or more of the rotor blades 22 to monitor the rotor blades 22. Further, as shown, a wind sensor 58 may be provided on the wind turbine 10. For example, the wind sensor 58 may be a wind vane, an anemometer, a LIDAR sensor, or another suitable sensor that measures wind speed and/or direction. In addition, a pitch sensor 59 may be configured with each of the pitch drive mechanism(s) 32, e.g. with one or more batteries of the pitch drive motors 33 thereof, which will be discussed in more detail below. As such, the sensors 57, 58, 59 may further be in communication with the controller 26, and may provide related information to the controller 26. For example, the pitch sensor(s) 59 may correspond to temperature sensors that send temperature signals to the controllers 26, 30 to indicate an actual temperature of the pitch batteries, which is described in more detail herein. Additional sensors (not illustrated) can include voltage and current sensors used as part of a test system for conducting test operations of a battery to determine remaining lifetime of the battery according to example embodiments of the present disclosure.

It should also be appreciated that, as used herein, the term "monitor" and variations thereof indicates that the various sensors of the wind turbine 10 may be configured to provide a direct measurement of the parameters being monitored and/or an indirect measurement of such parameters. Thus, the sensors described herein may, for example, be used to generate signals relating to the parameter being monitored, which can then be utilized by the controller 26 to determine the condition.

Figure 3:
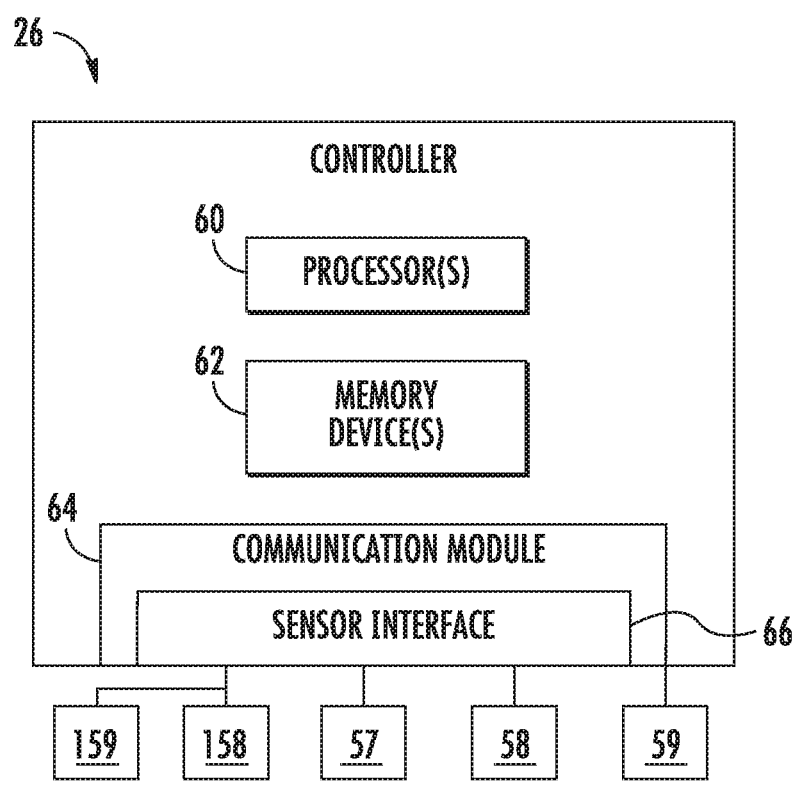
FIG. 3 illustrates a schematic diagram of one embodiment of suitable components that may be included in a wind turbine controller according to the present disclosure.

Referring now to FIG. 3, there is illustrated a block diagram of one embodiment of suitable components that may be included within the controller 26 according to the present disclosure. As used herein, a controller is one example of a control device. Other control devices can include microcontrollers, microprocessors, processing devices, application specific integrated circuits, or other devices configured to provide any of the control functionality and/or one or more of the operations of any of the methods disclosed herein.

As shown, the controller 26 may include one or more processor(s) 60 and associated memory device(s) 62 configured to perform a variety of computer-implemented functions (e.g., performing the methods, steps, calculations and the like and storing relevant data as disclosed herein). Additionally, the controller 26 may also include a communications module 64 to facilitate communications between the controller 26 and the various components of the wind turbine 10. For instance, the controller 26 can send control signals (e.g., via communications module 64) to switching elements (e.g., relays couple batteries to resistive load).

Further, the communications module 64 may include a sensor interface 66 (e.g., one or more analog-to-digital converters) to permit signals transmitted from one or more sensors 57, 58, 59 to be converted into signals that can be understood and processed by the processors 60. It should be appreciated that the sensors 57, 58, 59 may be communicatively coupled to the communications module 64 using any suitable means. For example, as shown in FIG. 3, the sensors 57, 58, 59 are coupled to the sensor interface 66 via a wired connection. However, in other embodiments, the sensors 57, 58, 59 may be coupled to the sensor interface 66 via a wireless connection, such as by using any suitable wireless communications protocol known in the art.

Other sensors can be in communication with the controller 26. For instance, a voltage sensor 158 can be in communication with the controller 26. The voltage sensor 158 can be part of a test system for a battery for powering a pitch adjustment mechanism. The voltage sensor 158 can be configured to measure an output voltage (e.g., discharge voltage) of the battery when the battery is coupled to a test resistive load.

A current sensor 159 can be in communication with the controller 26. The current sensor 159 can be part of a test system for a battery for powering a pitch adjustment mechanism. The current sensor 159 can be configured to measure an output current (e.g., discharge current) of the battery when the battery is coupled to a test resistive load.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 62 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 62 may generally be configured to store suitable computer-readable instructions that, when implemented by the processor(s) 60, configure the controller 26 to perform various functions including, but not limited to, transmitting suitable control signals to implement corrective action(s) in response to a distance signal exceeding a predetermined threshold as described herein, as well as various other suitable computer-implemented functions.

Figure 4:
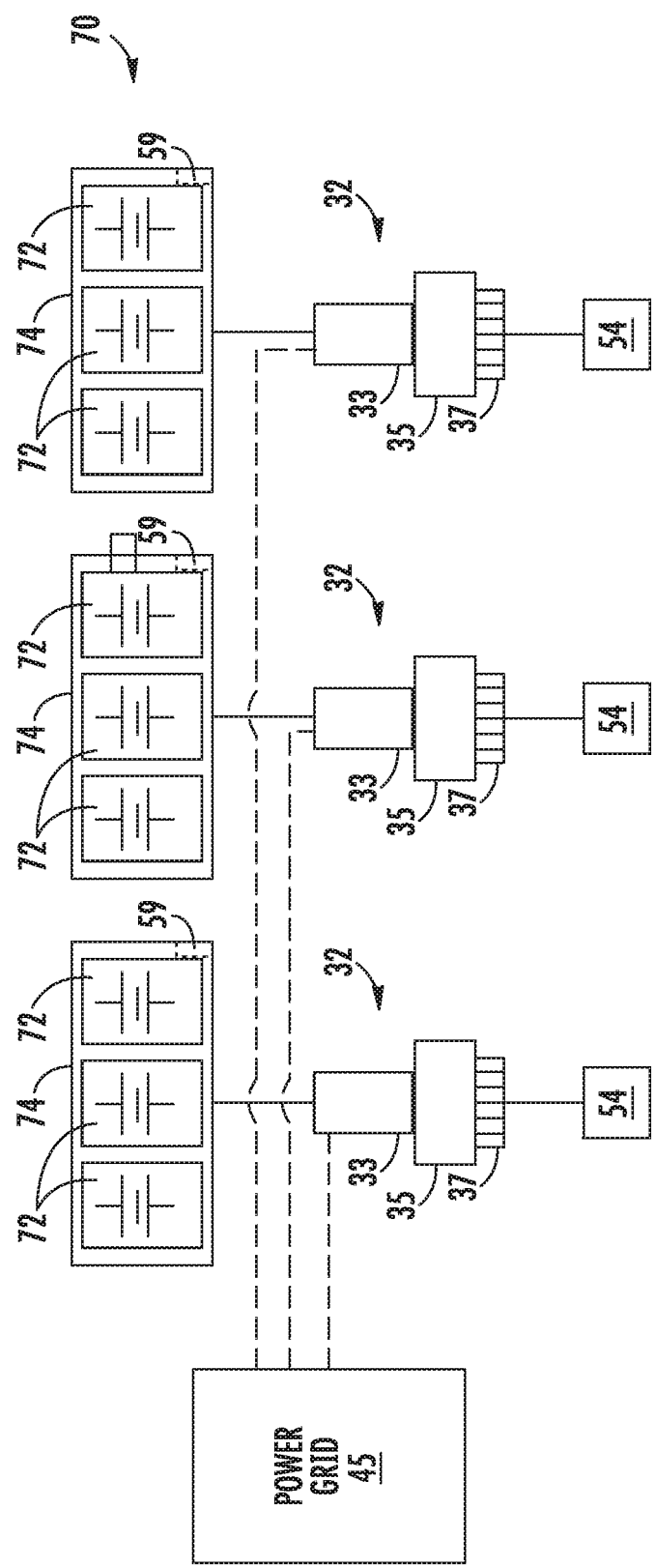
FIG. 4 illustrates a schematic diagram of one embodiment of a pitch system of a wind turbine according to the present disclosure.

Referring now to FIG. 4, a schematic diagram of one embodiment of an overall pitch system 70 for the wind turbine 10 is illustrated. More specifically, as shown, the pitch system 70 may include a plurality of pitch drive mechanisms 32, i.e. one for each pitch axis 34. Further, as shown, each of the pitch drive mechanisms may be communicatively coupled to the power grid 45 as well as one or more backup batteries 72. More specifically, as shown, each pitch drive mechanism 32 may be associated with a plurality of backup batteries 72 that are stored in a battery cabinet 74. Thus, in certain embodiments, the battery cabinets 74 may be thermally isolated containers.

During normal operation of the wind turbine 10, the pitch drive motors 33 are driven by the power grid 45. However, in some instances, such as during an adverse grid event or grid loss, the pitch drive motors 33 may be driven by one or more backup batteries 72. If pitching of the rotor blades 22 relies on such batteries 72 (i.e. due to a grid loss), it is important to ensure that the batteries 72 are capable of operating when needed. Thus, the turbine controller 26 (or pitch controller 30) is configured to implement a control strategy to estimate the consumed battery life of one or more of the batteries 72 of the pitch drive mechanisms 32 so as to reduce damaging loads from occurring during an adverse grid event of a wind turbine 10 or any other scenarios where battery power is used to pitch the rotor blades 22.

Figure 5:
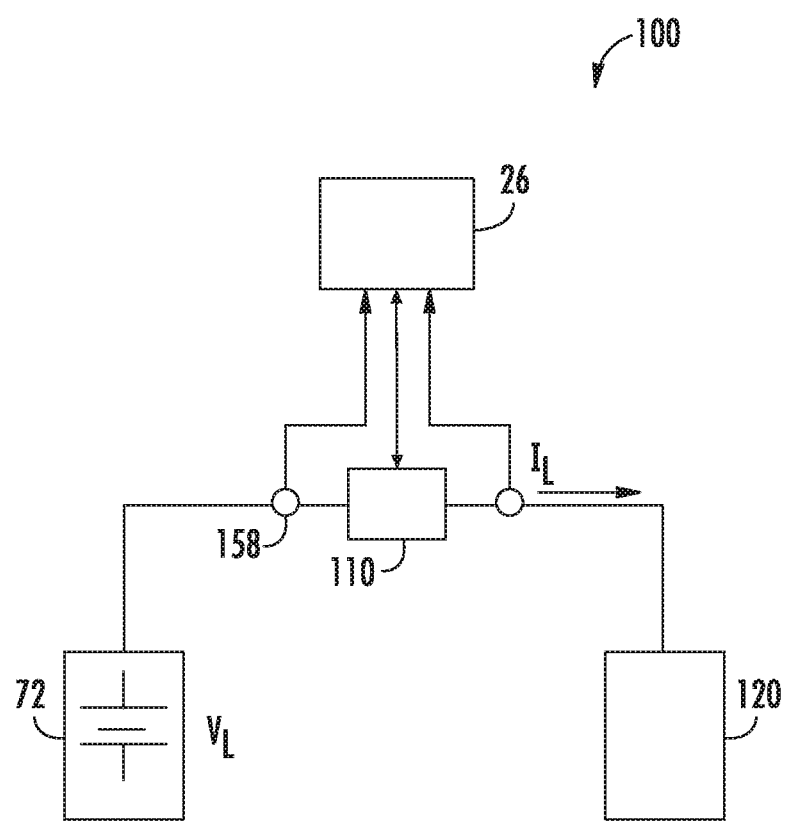
FIG. 5 illustrates a test system for a battery according to example embodiments of the present disclosure.

FIG. 5 depicts an example test system 100 for conducting a test operation of a battery to determine remaining lifetime of a battery (e.g., batteries 72) according to example embodiments of the present disclosure. The test system 100 includes a switching element 110, such as one or more relays, transistors, or other switching elements that can be controlled to be in a conducting state or non-conducting state. The test system 100 includes a resistive load 120 (e.g., a test resistive load). A control device (e.g., controller 26) can control switching element 110 to couple the battery 72 to the resistive load 120 to conduct a test operation for a time interval. The length of the time interval can be, for instance, about 6 seconds, about 5 seconds, about 10 seconds, about 1 second, or any other suitable time interval. During the test operation, the battery 72 discharges through the resistive load 120.

The test system 100 can include a voltage sensor 158 and a current sensor 159. The voltage sensor 158 can monitor an output voltage/discharge voltage ($V_L$) for the battery 72 during discharge of the battery 72 through the load 120. The current sensor 159 can monitor an output current/discharge current ($I_L$) of the battery 72 through the load 120. The test system can also include a sensor 59 (FIG. 4) that measures a temperature associated with the battery 72. For instance, the sensor 59 can measure a temperature of a battery cabinet 74 enclosing the battery 72. In some embodiments, because the temperature of the battery can lag the measured temperature in the cabinet, a model can be used to estimate the internal temperature of the battery based on the measured cabinet temperature. The model can correlate internal temperature relative to measured cabinet temperature over time. As another example, the sensor 59 can measure a temperature associated with one or more battery chargers used to charge the battery.

The control device (e.g., controller 26) can be configured to determine a remaining lifetime for the battery 72 based on data indicative of the temperature associated with the battery, the discharge voltage $V_L$ and the discharge current $I_L$. For instance, the controller 26 can execute computer-readable instructions stored in a memory to perform operations to determine a remaining lifetime for the battery 72.

Figure 6:
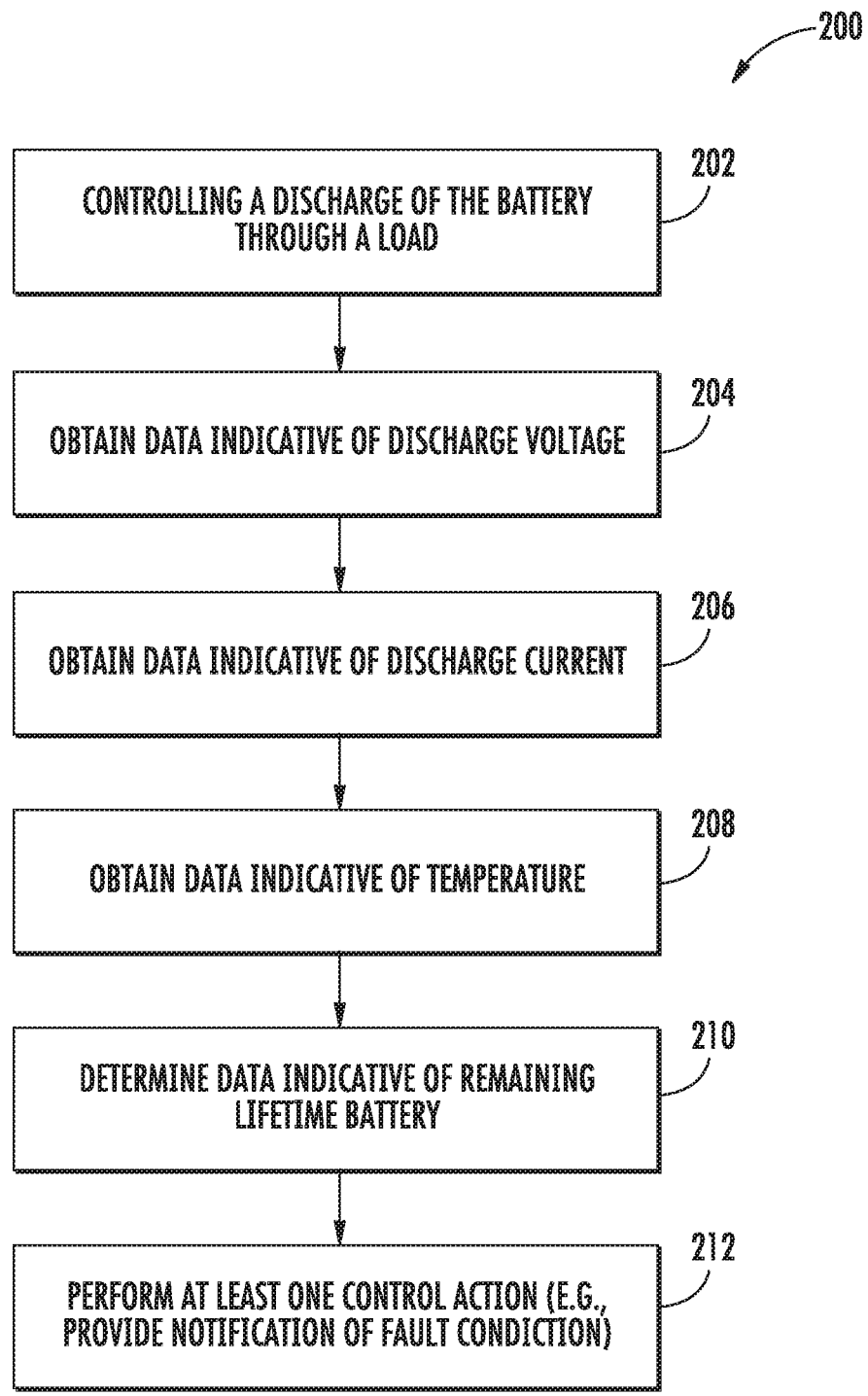
FIG. 6 depicts a flow diagram of an example method according to example embodiments of the present disclosure.

For instance, FIG. 6 depicts a flow diagram of an example method (200) (e.g., operations) for determining a lifetime remaining of a battery according to example embodiments of the present disclosure. The method (200) can be implemented, for instance, by controller 26 or other control device(s). FIG. 6 depicts steps performed in a particular order for purposes of illustration and discussion. Those of ordinary skill in the art, using the disclosures provided herein, will understand that various steps of any of the methods disclosed herein can be adapted, expanded, rearranged, performed simultaneously, and/or rearranged in various ways without deviating from the scope of the present disclosure.

At (202), the method can include controlling a discharge of the battery through a load. For instance, the controller 26 can send a control signal to switching element 110 to couple the battery 72 to the resistive load 120.

At (204), the method can include obtaining data indicative of a discharge voltage of the battery during discharge through the load. For instance, the controller 26 can obtain data from voltage sensor 158 indicative of discharge voltage $V_L$.

At (206), the method can include obtaining data indicative of a discharge current of the battery during discharge through the load. For instance, the controller 26 can obtain data from current sensor 159 indicative of discharge current $I_L$.

At (208), the method can include obtaining data indicative of a temperature associated with the battery, such as a temperature of the cabinet housing the battery and/or a temperature of one or more battery chargers used to charge the battery. For instance, the controller 26 can obtain data from temperature sensor 59 indicative of a temperature of battery cabinet 74 of the battery 72.

At (210), the method can include determining data indicative of remaining lifetime of the battery. For instance, the controller 26 can execute logic (e.g., computer-readable instructions) to perform operations to determine remaining lifetime of the battery based at least in part on the data indicative of the discharge voltage $V_L$, the data indicative of the discharge current $I_L$, and the temperature associated with the battery 72.

In example embodiments, the data indicative of remaining lifetime can be associated with internal resistance of the battery. The internal resistance can be determined as function of at least the discharge voltage and the discharge current as discussed with reference to FIG. 7 below.

In some embodiments, the data indicative of estimated lifetime of the battery can include a ratio of a difference between the internal resistance and an end of life resistance associated with the battery to a difference between a beginning of life resistance and an end of life resistance associated with the battery.

As used herein, an end of life resistance of a battery refers to a resistance value at or near internal resistance of a battery at end of life (e.g., within 20% of the internal resistance of the battery at end of life). The end of life resistance can vary as a function of temperature associated with the battery. The end of life resistance can be determined from specification from the battery manufacturer or from test data from testing batteries of similar construction.

As used herein, a beginning of life resistance of a battery refers to a resistance value at or near internal resistance of a battery at beginning of life. (e.g., within 20% of the internal resistance of the battery at beginning of life). The beginning of life resistance can vary as a function of temperature associated with the battery. The beginning of life resistance can be determined from specification from the battery manufacturer or from test data from testing batteries of similar construction.

Figure 7:
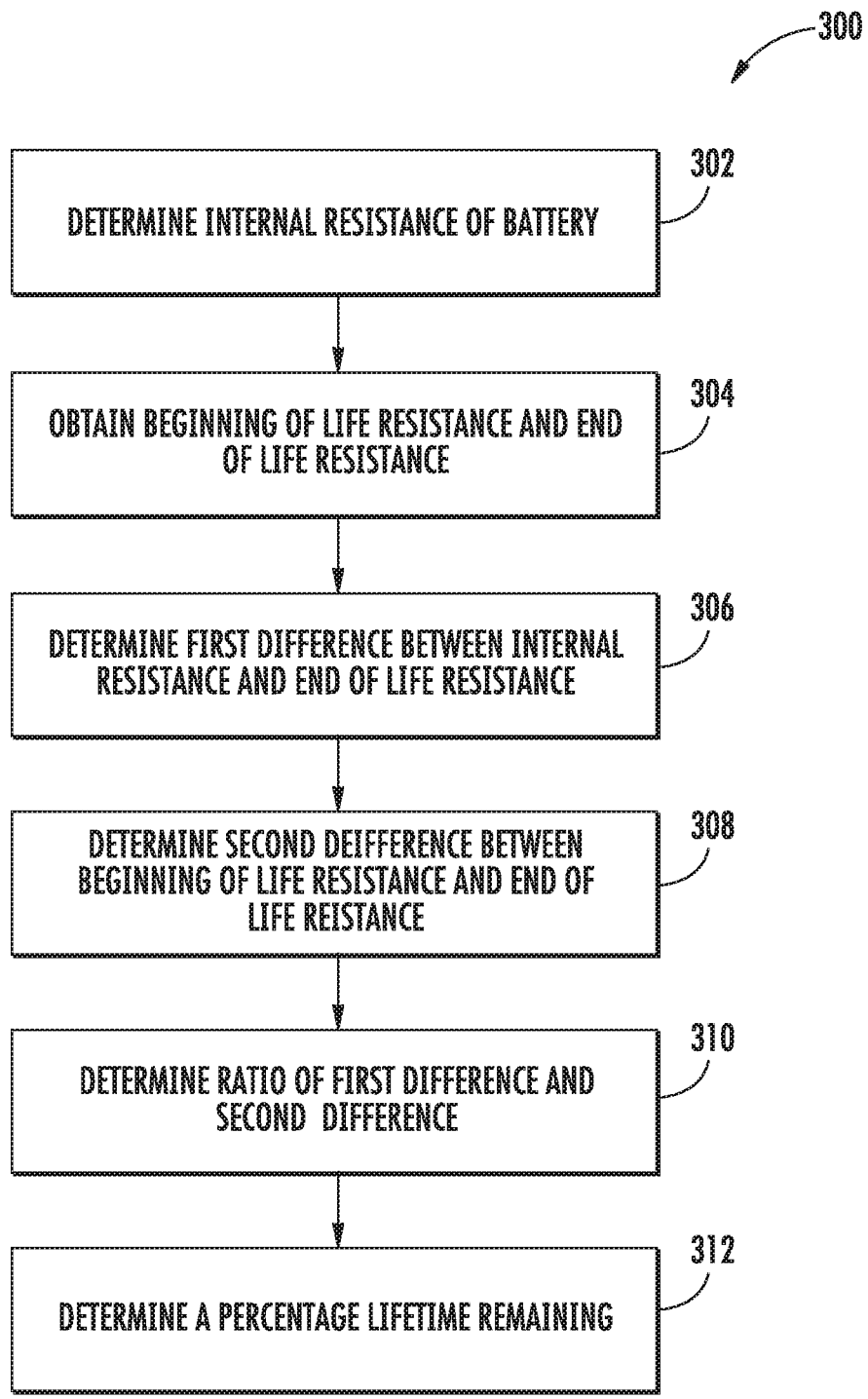
FIG. 7 depicts a flow diagram of an example method according to example embodiments of the present disclosure.

FIG. 7 depicts a flow diagram of one example method (300) of performing operations to determine data indicative of remaining lifetime of the battery according to example embodiments of the present disclosure. The method (300) can be implemented, for instance, by controller 26 or other control device(s). FIG. 7 depicts steps performed in a particular order for purposes of illustration and discussion. Those of ordinary skill in the art, using the disclosures provided herein, will understand that various steps of any of the methods disclosed herein can be adapted, expanded, rearranged, performed simultaneously, and/or rearranged in various ways without deviating from the scope of the present disclosure.

At (302), the method includes determining an internal resistance of the battery as a function of at least the discharge voltage and the discharge current. For instance, in one implementation, the internal resistance can be determined by determining a difference between a no load voltage of the battery and the discharge voltage of the battery. The difference can be divided by the discharge current. As an example, the internal resistance of the battery can be determined based at least in part on the following:

$$R_{Internal} = (V_{NoLoad} - V_L)/I_L$$

where $R_{Internal}$ is the internal resistance, $V_{NoLoad}$ is a no load voltage associated with the battery, $V_L$ is the discharge voltage and $I_L$ is the discharge current. In some embodiments, $V_{NoLoad}$ can be a constant that is obtained from manufacturer specifications or testing of batteries of similar construction.

At (304), the method can include obtaining data indicative of beginning of life resistance and end of life resistance of the battery. As these values can be dependent on temperature, the beginning of life resistance and end of life resistance for the battery can be determined based at least in part on the data indicative of the temperature associated with the battery.

At (306), the method can include determining a first difference between the internal resistance and the end of life resistance. For instance, the internal resistance can be subtracted from the end of life resistance (or vice versa) to determine the first difference.

At (308), the method can include determining a second difference between the beginning of life resistance and the end of life resistance. For instance, the beginning of life resistance can be subtracted from the end of life resistance (or vice versa) to determine the second difference.

At (310), the method can include determining a ratio of the first difference and the second difference. For instance, the first difference can be divided by the second difference.

At (312), the ratio can be expressed as a percentage of lifetime remaining. For example, if the ratio is determined to be 0.20, the percentage of lifetime remaining can be 20%. As another example, if the ratio is determined to be 0.34, the percentage of lifetime remaining can be 34%.

Figure 8:
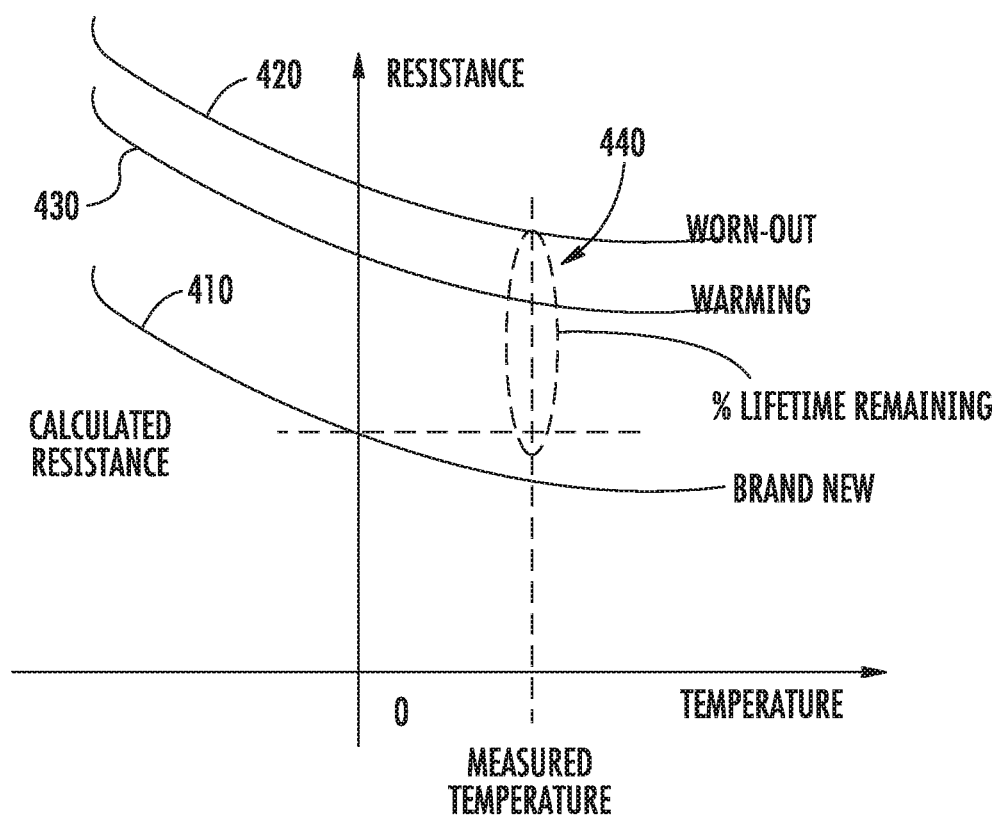
FIG. 8 depicts a graphical representation of determining a remaining lifetime of a battery according to example embodiments of the present disclosure.

FIG. 8 depicts a graphical representation of determining a remaining lifetime of a battery according to example embodiments of the present disclosure. FIG. 8 plots measured temperature along the horizontal axis and internal resistance of the battery along the vertical axis. Curve 410 represents the beginning of life resistance as a function of temperature. Curve 420 represents the end of life resistance as a function of temperature. Curve 430 represents a threshold resistance as a function of temperature. Curve 430 can be used to determine when to take a control action based on the internal resistance. As shown in FIG. 8, the calculated resistance can be used to determine a percent lifetime remaining. Area 440 represents the percent lifetime remaining of the battery. In some embodiments, the threshold curve 430 can be compensated based on the charge of the battery, especially in cases where the batteries are not fully charged.

Referring back to FIG. 6 at (212), the method can include performing at least one control action based at least in part on the data indicative of remaining lifetime of the battery. For instance, the controller 26 can implement at least one control action based at least in part on the data indicative of remaining lifetime of the battery.

In some embodiments, if the data indicative of remaining lifetime of the battery falls below a threshold, the method can include performing the control action. In some embodiments, the test operation can be performed multiple times at regular or irregular time intervals to determine a plurality of estimates of remaining lifetime for the battery (e.g., a plurality of internal resistances for the battery). An average remaining lifetime for the battery can be determined. A control action can be performed when the average remaining lifetime falls below a threshold.

The control action can include providing a notification of a fault condition associated with the battery. For instance, the controller 26 can send a notification using any suitable output device (e.g., display screen, visual indicator, audio speaker, or other suitable output device) indicative of a fault condition of the battery. The fault condition can be indicative of the battery nearing end of life. The notification can be associated with replacing the battery. For instance, in response to the notification, the battery can be replaced with a new battery or battery with more remaining lifetime.

Additionally and/or alternatively, the control action can include shutting down the wind turbine until the battery is replaced. For instance, the turbine can be shut down when the remaining lifetime of the battery is below a certain threshold. This threshold can be far enough away from the end of life threshold to avoid battery failure before the next retest.

In some embodiments, the method can be performed and/or modified based on data from multiple batteries. For instance, the data from a battery can be compared to data from a set of batteries, such as a set of batteries within the same axis, turbine, or age group. If, for example, several or all batteries in the set exhibit the same characteristic, such as being at a similar voltage below the end of life threshold, it can be determined that a condition such as temperature is causing the characteristic. In response to this, the method can be modified. For instance, the voltage threshold can be adjusted or trained at varying temperatures to reflect deviation learned from field experience to better reflect the actual end of life threshold at each temperature.

Additionally and/or alternatively, the frequency of the tests can be determined based on data from the battery. For instance, the frequency of the tests can be based upon the remaining lifetime of the battery, such as increasing or decreasing the frequency of the tests as the battery approaches end of life. For example, the controller 26 can be configured to test the battery infrequently near beginning of life and gradually more frequently as it approaches end of life. This can reduce unnecessary cycling of the batteries caused by testing while ensuring a battery does not reach end of life and fail between tests.

In some embodiments, past patterns of misses, such as if the method was not effective in detecting a failing battery prior to failure, can be identified. These past patterns of misses can be used to modify the method. For instance, the past patterns of misses can be used to detect that the algorithm generally was not efficient at detecting failing batteries under a certain pattern of turbine or environmental conditions. The algorithm can then be adjusted or modified based on the past pattern of misses.

In some embodiments, an additional check can be used to help determine false positives. For instance, the battery can be flagged for recheck based on a recheck algorithm to avoid an early replacement based on a false positive. Additionally and/or alternatively, the battery data can be considered, such as by a human, and determined to be in a false positive condition, in which case steps such as a retest and/or ignoring the false positive can be taken.

Figure 9:
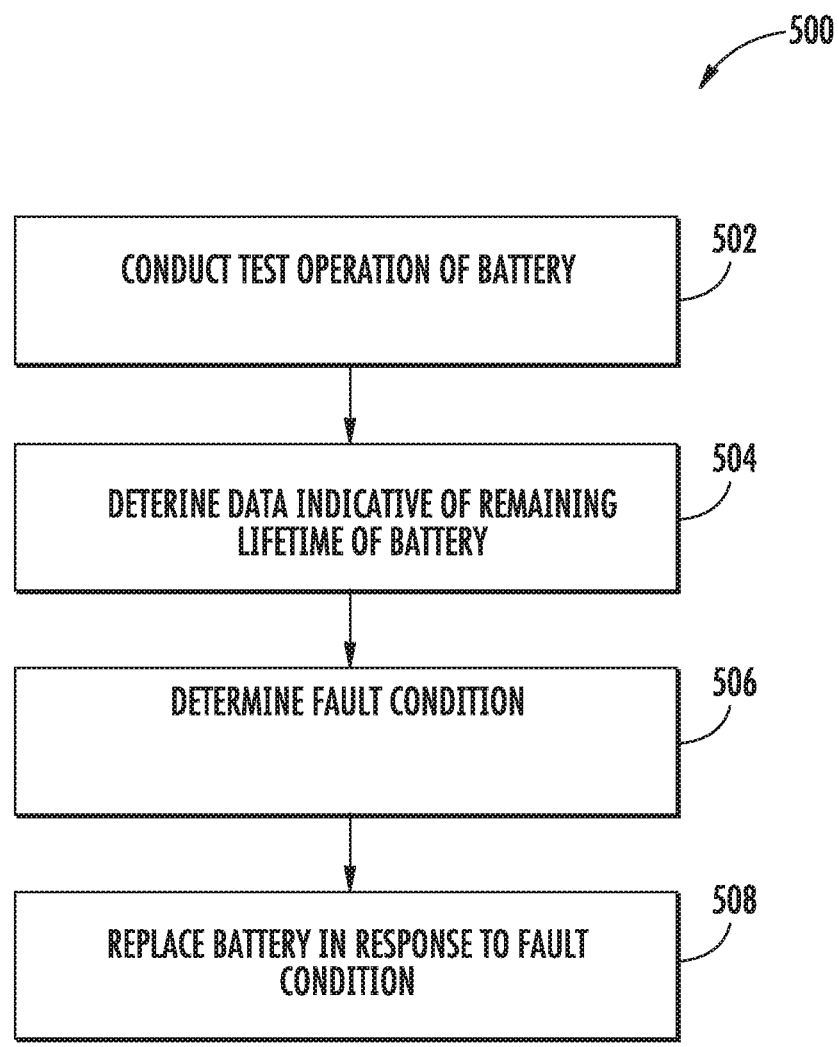
FIG. 9 depicts a flow diagram of an example method according to example embodiments of the present disclosure.

FIG. 9 depicts a flow diagram of an example method (500) for preventing damage to a wind turbine according to example embodiments of the present disclosure. The method (500) can be at least partially implemented, for instance, by controller 26 or other control device(s). The method (500) is used to ensure that a battery used to power a pitch system of a wind turbine does not fail during operation. FIG. 9 depicts steps performed in a particular order for purposes of illustration and discussion. Those of ordinary skill in the art, using the disclosures provided herein, will understand that various steps of any of the methods disclosed herein can be adapted, expanded, rearranged, performed simultaneously, and/or rearranged in various ways without deviating from the scope of the present disclosure.

At (502), the method includes conducting a test operation of the battery, such as any of the test operations of the battery disclosed herein. At (504), the method includes determining data indicative of remaining lifetime of a battery according to any of the methods or operations for determining remaining lifetime disclosed herein. At (506), a fault condition can be determined based on the remaining lifetime of the battery. For instance, a fault condition can be determined when the remaining lifetime of the battery is below a threshold. At (508), the method can include replacing the battery in response to the fault condition. In this way, the method can increase the likelihood that a fresh battery will be available to power a pitch system of a wind turbine.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for determining the remaining lifetime of a battery, the method comprising:
controlling, by one or more control devices, a discharge of the battery through a load;
obtaining, by the one or more control devices, data indicative of a discharge voltage and a discharge current of the battery during discharge through the load;
determining, by the one or more control devices, an internal resistance of the battery based on the discharge voltage and the discharge current;
obtaining, by the one or more control devices, data indicative of a beginning of life resistance and an end of life resistance associated with the battery;

determining, by the one or more control devices, data indicative of remaining lifetime of the battery as a function of the internal resistance, the beginning of life resistance, and the end of life resistance, wherein the data indicative of the remaining lifetime of the battery comprises a ratio of a difference between the internal resistance and the end of life resistance to a difference between the beginning of life resistance and the end of life resistance; and performing, by the one or more control devices, at least one control action based at least in part on the data indicative of the remaining lifetime of the battery.

2. The method of claim 1, wherein the data indicative of beginning of life resistance and the data indicative of end of life resistance is determined based at least in part on the data indicative of the temperature of the battery.

3. The method of claim 1, wherein determining, by the one or more control devices, data indicative of the remaining lifetime of the battery comprises:

determining, by the one or more control devices, the internal resistance of the battery as a function of at least the discharge voltage and the discharge current;

obtaining, by the one or more control devices, data indicative of a beginning of life resistance and data indicative of an end of life resistance for the battery; and determining, by the one or more control devices, a first difference between the internal resistance and the end of life resistance;

determining, by the one or more control devices, a second difference between the beginning of life resistance and the end of life resistance; and determining, by the one or more computing devices, a ratio of the first difference to the second difference; and determining, by the one or more computing devices, a percentage lifetime remaining based on the ratio.

4. The method of claim 1, wherein the control action comprises providing a notification of a fault condition based at least in part on the data indicative of remaining lifetime of the battery.

5. The method of claim 4, wherein the notification is associated with replacing the battery.

6. The method of claim 1, wherein the battery is stored in a battery cabinet, the temperature associated with the battery corresponding to a cabinet temperature of the battery cabinet.

7. The method of claim 1, where in the battery is stored in a battery cabinet containing one or more batteries and one or more battery chargers, the temperature associated with the battery corresponding to the temperature of the one or more battery chargers.

8. The method of claim 3, wherein the method comprises:

determining an average percentage lifetime remaining for the battery based at least in part on a plurality of internal resistances determined for each of a plurality of time intervals; and providing a notification of a fault condition based at least in part on the average percentage lifetime.

9. A method for preventing damaging loads from occurring during an adverse grid event of a wind turbine, the method comprising:

conducting a test operation of at least one battery used to power a pitch drive mechanism of a rotor blade of the wind turbine, wherein the test operation comprises determining a discharge voltage and a discharge current of the battery;

determining an internal resistance of the battery based on the discharge voltage and the discharge current;

obtaining data indicative of a beginning of life resistance and an end of life resistance associated with the battery;

determining data indicative of remaining lifetime of the battery as a result of the one or more test operations as a function of the internal resistance, the beginning of life resistance, and the end of life resistance during the test operation, wherein the data indicative of the remaining lifetime of the battery comprises a ratio of a difference between the internal resistance and the end of life resistance to a difference between the beginning of life resistance and the end of life resistance;

determining a fault condition based at least in part on data indicative of remaining lifetime of the battery; and taking a preventive action based at least in part on the fault condition.

10. The method of claim 9, wherein taking a preventive action comprises replacing the battery in response to the fault condition.

11. The method of claim 9, wherein the test operation comprises:

coupling the battery to a resistive load to discharge the battery through the resistive load;

determining a temperature associated with the battery; and determining data indicative of remaining lifetime of the battery as a function of the discharge voltage, discharge current, and the temperature.

12. The method of claim 9, wherein the data indicative of the beginning of life resistance and the end of life resistance is determined based at least in part on data indicative of the temperature of the battery.

* * * * *